United States Patent
Huang

(10) Patent No.: US 11,899,049 B2
(45) Date of Patent: Feb. 13, 2024

(54) COMPARISON CIRCUIT AND OPERATION METHOD THEREOF HAVING ADAPTIVE COMPARISON MECHANISM

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/973,039

(22) Filed: Oct. 25, 2022

(65) Prior Publication Data
US 2023/0184816 A1 Jun. 15, 2023

(30) Foreign Application Priority Data
Dec. 14, 2021 (TW) .................................. 110146780

(51) Int. Cl.
*G01R 19/00* (2006.01)
*G01R 19/165* (2006.01)
*H03K 5/24* (2006.01)

(52) U.S. Cl.
CPC ... *G01R 19/16576* (2013.01); *G01R 19/0038* (2013.01); *H03K 5/249* (2013.01)

(58) Field of Classification Search
CPC ............ G01R 19/0038; G01R 19/2506; G01R 19/16576; H03K 5/2418; H03K 5/2445; H03K 5/2481; H03K 5/249
See application file for complete search history.

(56) References Cited

U.S. PATENT DOCUMENTS

| | | | |
|---|---|---|---|
| 9,369,137 B2* | 6/2016 | Masuko | H03M 1/125 |
| 9,577,658 B1* | 2/2017 | Wang | H03K 5/249 |
| 2012/0032824 A1* | 2/2012 | Yoshioka | H03L 7/0814 |
| | | | 327/155 |

OTHER PUBLICATIONS

Liu et al. "2011_12_JSSC_A 12-bit 45-MS_ps, 3-mW Redundant Successive-Approximation-Register Analog-to-Digital Converter With Digital Calibration", Nov. 2011, IEEE Journal of solid-state circuits, vol. 46.

(Continued)

*Primary Examiner* — Quan Tra
(74) *Attorney, Agent, or Firm* — WPAT, P.C.

(57) ABSTRACT

The present invention discloses a comparison circuit having adaptive comparison mechanism is provided. A comparator is enabled by an enabling signal having an enabling state during a comparison stage to compare a first voltage and a second voltage to generate a comparison result. A comparison determining circuit sets a stage indication signal at an unfinished state and a finished state before and after the comparison result is generated. A time accumulating circuit starts to accumulate an accumulated time when the enabling signal is at the enabling state and stops accumulating when the stage indication signal is at the finished state to generate a comparison time. A determining circuit performs statistics on the comparison time to generate a predetermined threshold time and sets a predetermined comparison result as the comparison result under the condition that the comparison result is not generated and the accumulated time exceeds the predetermined threshold time.

12 Claims, 6 Drawing Sheets

(56) References Cited

OTHER PUBLICATIONS

Shikata et al. "2012_04_JSSC_A 0.5 V 1.1 MS_psec 6.3 fJ_pConversion-Step SAR-ADCWith Tri-Level Comparator in 40 nm CMOS", Apr. 2012, IEEE Journal of solid-state circuits, vol. 47.
Nam et al. "2013CICC_A 95-MSs 11-bit 1.36-mW Asynchronous SAR ADC with Embedded Passive Gain in 65nm CMOS", 2013, IEEE.
Jiang et al. "CICC_2010_Single-Channel, 1.25-GSs, 6-bit, Loop-Unrolled", 2010, IEEE.
"ISSCC2014-11 Data Converter Techniques", 2014, University of Pennsylvania, USA.

* cited by examiner

COMPARISON CIRCUIT AND OPERATION METHOD THEREOF HAVING ADAPTIVE COMPARISON MECHANISM

BACKGROUND OF THE INVENTION

1. Field of the Invention

The present invention relates to a comparison circuit and a comparison circuit operation method thereof having adaptive comparison mechanism.

2. Description of Related Art

The comparison circuit is a circuit configured to compare a plurality of signals and is used in different types of circuits. For example, the comparison circuit can be used in an analog-to-digital conversion circuit that converts a continuous analog signal or physical amount (which is typically a voltage) to a digital signal. A successive-approximation analog-to-digital conversion circuit processes and perform comparison on the input analog signal according to different configurations of a digital-to-analog circuit and the operation of the comparison circuit, such that the input signal can be tracked. However, the comparison time of the comparison circuit varies due to the factors such as temperature, manufacturing process and voltage. When the comparison time is not stable, the efficiency of comparison circuit is affected.

SUMMARY OF THE INVENTION

In consideration of the problem of the prior art, an object of the present invention is to supply a comparison circuit and a comparison circuit operation method thereof having adaptive comparison mechanism.

The present invention discloses a comparison circuit having adaptive comparison mechanism that includes a comparator, a comparison determining circuit, a time accumulating circuit and a determining circuit. The comparator is configured to be enabled by an enabling signal at an enabling state in a comparison stage so as to compare a first voltage and a second voltage to generate a comparison result. The comparison determining circuit is configured to set a stage indication signal to be a comparison stage unfinished state in the comparison stage before the comparison result is generated, and set the stage indication signal to be a comparison stage finished state in the comparison stage after the comparison result is generated. The time accumulating circuit is configured to begin accumulating an accumulated time when the enabling signal is at the enabling state and stop accumulating the accumulated time when the stage indication signal is at the comparison stage finished state to generate a comparison time. The determining circuit is configured to perform statistics on the comparison time in the comparison stage to generate a predetermined threshold time, and further set a predetermined comparison result as the comparison result under the condition that the comparison result is not generated and the accumulated time exceeds the predetermined threshold time in the comparison stage.

The present invention also discloses a comparison circuit operation method having adaptive comparison mechanism that includes the steps outlined below. A comparator is enabled by an enabling signal at an enabling state in a comparison stage so as to compare a first voltage and a second voltage to generate a comparison result. A stage indication signal is set to be a comparison stage unfinished state in the comparison stage before the comparison result is generated, and the stage indication signal is set to be a comparison stage finished state in the comparison stage after the comparison result is generated by a comparison determining circuit. An accumulated time is began to be accumulated when the enabling signal is at the enabling state and the accumulated time is stopped to be accumulated when the stage indication signal is at the comparison stage finished state to generate a comparison time by a time accumulating circuit. Statistics on the comparison time is performed in the comparison stage to generate a predetermined threshold time, and a predetermined comparison result is further set to be the comparison result under the condition that the comparison result is not generated and the accumulated time exceeds the predetermined threshold time in the comparison stage by a determining circuit.

These and other objectives of the present invention will no doubt become obvious to those of ordinary skill in the art behind reading the following detailed description of the preferred embodiments that are illustrated in the various figures and drawings.

DETAILED DESCRIPTION OF THE PREFERRED EMBODIMENTS

An aspect of the present invention is to provide a comparison circuit and a comparison circuit operation method thereof having adaptive comparison mechanism to perform statistics on a comparison time of a comparator and set a predetermined threshold time, such that when a comparison result is generated under the condition that an accumulated time of the operation of the comparator exceeds the predetermined threshold time, a predetermined comparison result is directly set to be the comparison result. The condition that the comparison result is not generated in a comparison time that is too long can be avoided.

Figure 1A:
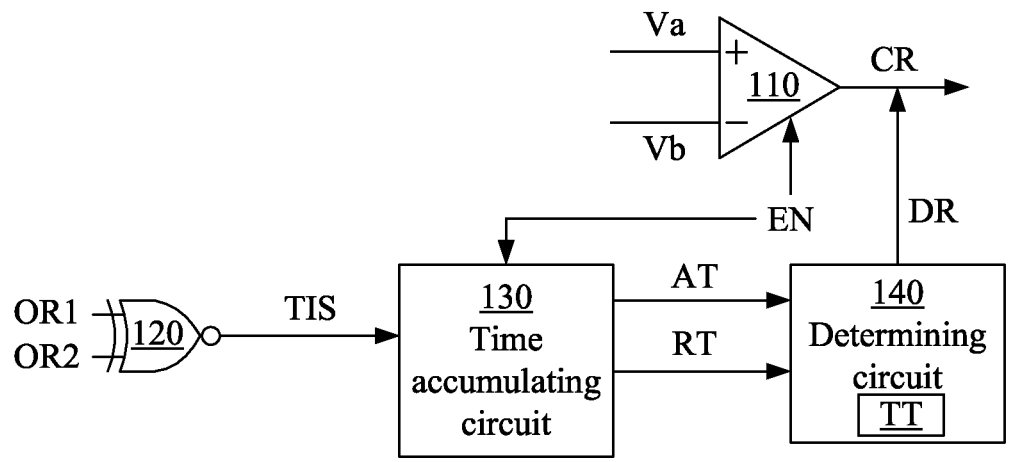
FIG. 1A illustrates a block diagram of a comparison circuit having adaptive comparison mechanism according to an embodiment of the present invention.
Figure 1B:
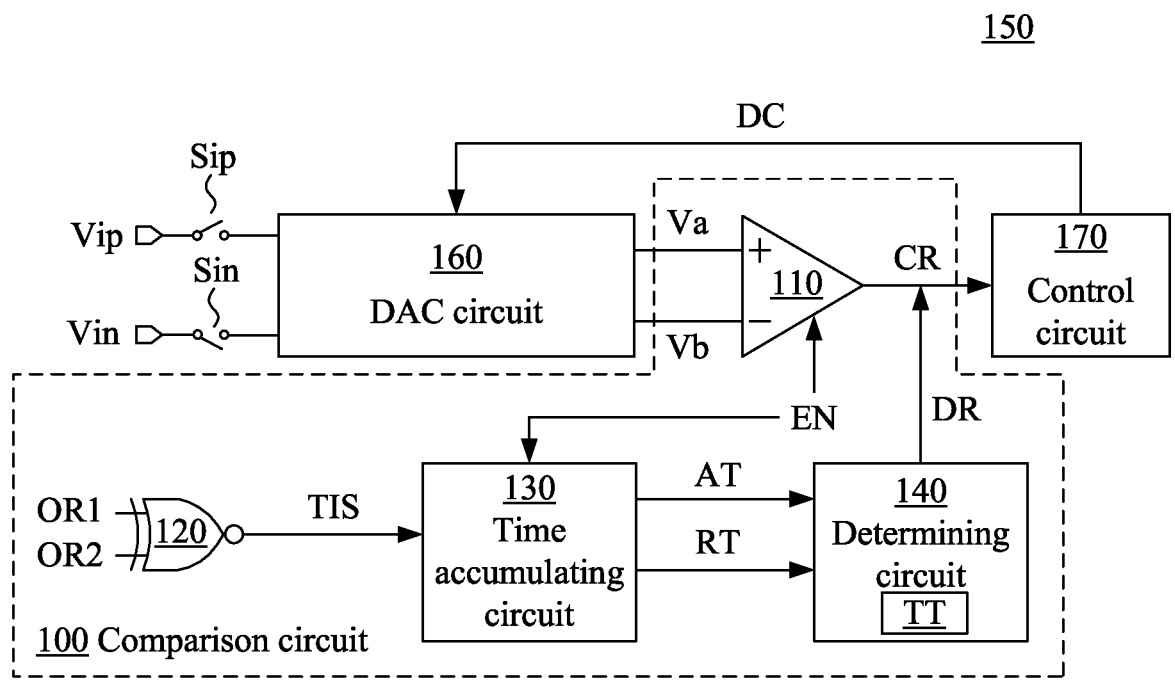
FIG. 1B illustrates a block diagram of an analog-to-digital conversion circuit that includes the comparison circuit according to an embodiment of the present invention.

Reference is now made to FIG. 1A and FIG. 1B at the same time. FIG. 1A illustrates a block diagram of a comparison circuit 100 having adaptive comparison mechanism according to an embodiment of the present invention. FIG. 1B illustrates a block diagram of an analog-to-digital conversion (ADC) circuit 150 that includes the comparison circuit 100 according to an embodiment of the present invention.

The comparison circuit 100 includes a comparator 110, a comparison determining circuit 120, a time accumulating circuit 130 and a determining circuit 140.

The comparator 110 is configured to compare a first voltage Va and a second voltage Vb in a comparison state to generate a comparison result CR. In each of a plurality of comparison stages, the circuit components included in the comparator 110 are affected by various factors such as temperature, voltage and manufacturing process such that the comparison time, the time duration from the beginning of the comparison to the generation of the comparison result, varies accordingly and is not a steady value. When the comparator 110 does not generate the comparison result CR in a comparison time that is overly long, a dealing mechanism is required to avoid the system instability.

As a result, the comparison determining circuit 120, the time accumulating circuit 130 and the determining circuit 140 operate together to perform statistics on the comparison time of the comparator 110 to further set a predetermined threshold time. In each of the comparison stages, when an accumulated time that the comparator 110 performs comparison is determined to exceed the predetermined threshold time, a predetermined comparison result can be directly set to be the comparison result CR.

In an embodiment, the comparison circuit 100 can be used in the analog-to-digital conversion circuit 150 illustrated in FIG. 1B. The operation of the circuit components in the analog-to-digital conversion circuit 150 and the application of the comparison circuit 100 in the analog-to-digital conversion circuit 150 are described in detail in the following paragraphs.

The analog-to-digital conversion circuit 150 includes the comparison circuit 100, a digital-to-analog conversion (DAC) circuit 160 and a control circuit 170.

In operation, in each round of analog-to-digital conversion, the digital-to-analog conversion circuit 160 samples a positive terminal input voltage Vip and a negative terminal input voltage Vin and outputs a first voltage Va and a second voltage Vb. The comparator 110 compares the first voltage Va and the second voltage Vb to generate the comparison result CR. The control circuit 170 generates a set of digital codes DC according to the comparison result CR to switch a configuration of the digital-to-analog conversion circuit 160.

The digital-to-analog conversion circuit 160, the comparator 110 and the control circuit 170 together form a loop to keep performing the procedure described above in a plurality of comparison stages. The control circuit 170 outputs the set of digital codes DC as a digital output signal DOUT when a difference between the first voltage Va and the second voltage Vb is smaller than a predetermined level. In an embodiment, the predetermined level described above is an amount of a least significant bit (LSB).

The digital-to-analog conversion circuit 160 samples the positive terminal input voltage Vip and the negative terminal input voltage Vin and output the first voltage Va and the second voltage Vb.

In an embodiment, the digital-to-analog conversion circuit 160 may include such as, but not limited to a positive terminal capacitor array, a negative terminal capacitor array and a switching circuit (not illustrated in the figure). The positive terminal capacitor array and the negative terminal capacitor array can be respectively coupled to an analog signal source through a switch Sip and a switch Sin. When the switch Sip and the switch Sin are enabled, the positive terminal capacitor array and the negative terminal capacitor array respectively receive the positive terminal input voltage Vip and negative terminal input voltage Vin.

When the switch Sip and the switch Sin are disabled, the positive terminal capacitor array and the negative terminal capacitor array are disconnected from the analog signal source and finish sampling. The switching circuit switches the configuration of the positive terminal capacitor array and the negative terminal capacitor array by receiving the digital codes DC, such that different values of the positive terminal output voltage Va and the negative terminal output voltage Vb are outputted.

The comparator 110, in each of the comparison stages, is enabled by an enabling signal EN at an enabling state so as to compare the first voltage Va and the second voltage Vb to generate the comparison result CR.

In an embodiment, the enabling signal EN can be generated by a logic circuit (not illustrated in the figure) that performs logic operation. The logic circuit can perform logic operation according to such as, but not limited to a signal indicating that the sampling is finished being performed, a signal indicating that the comparator 110 does not finish performing comparison and a signal indicating that analog-to-digital conversion is not finished being performed, to generate the enabling signal EN at the enabling state. As a result, the comparator 110 can be enabled to perform comparison when the digital-to-analog conversion circuit 160 finishes performing sampling, the comparator 110 does not generate the comparison result CR and at least one unfinished comparison stage is presented.

Besides, when the digital-to-analog conversion circuit 160 does not finish performing sampling, the comparator 110 already generates the comparison result CR or all the comparison stages are finished being performed such that the analog-to-digital conversion is finished being performed, the logic circuit described above can perform logic operation accordingly to generate the enabling signal EN at a disabling state to disable the comparator 110. As a result, the comparator 110 operates according to the enabling signal EN at the enabling state and the disabling state back and forth in each of the comparison stages after the sampling is finished being performed, until all the comparison stages are finished being performed such that the analog-to-digital conversion is finished being performed.

It is appreciated that the generation of the enabling signal EN described above is merely an example. When the comparison circuit 100 is used in other types of circuits, the enabling signal EN can be generated by using different methods. The present invention is not limited thereto.

In an embodiment, after comparing the first voltage Va and the second voltage Vb, the comparator 110 generates two output results OR1 and OR2. When one of the output results OR1 and OR2 is at a high state and the other one is at a low state, the comparator 110 already confirms that one of the first voltage Va and the second voltage Vb is larger than the other such that the comparison result CR is generated. On the contrary, when both the output results OR1 and OR2 are at the low state, the comparator 110 cannot confirm which of the first voltage Va and the second voltage Vb is larger than the other such that the comparison result CR is not generated.

It is appreciated that the form of the comparison result CR generated by the comparator 110 is merely an example. In other embodiments, the comparator 110 may generate signals in other forms or different combinations of signals as the comparison result CR.

The control circuit 170, in each of the comparison stages, switches the configuration of the digital-to-analog conversion circuit 160 by using the set of the digital codes DC according to the comparison result CR. The control circuit 170 further outputs the corresponding set of digital codes DC as the digital output signal DOUT when the difference between the first voltage Va and the second voltage Vb is smaller than the predetermined level.

The comparison determining circuit 120 is electrically coupled to the comparator 110. The comparison determining circuit 120, in each of the comparison stages, sets a stage indication signal TIS to be a comparison stage unfinished state before the comparison result CR is generated. The comparison determining circuit 120, in each of the comparison stages, sets the stage indication signal TIS to be a comparison stage finished state in the comparison stage after the comparison result is generated.

In an embodiment, the comparison determining circuit 120 receives the two output results OR1 and OR2 generated by the comparator 110 described above to determine whether the comparison result CR is generated. For example, the comparison determining circuit 120 can be implemented by using a XOR gate such that when both of the output results OR1 and OR2 are at the low state (the comparison result CR is not generated yet), the comparison determining circuit 120 sets the stage indication signal TIS at the comparison stage unfinished state. When one of the output results OR1 and OR2 is at the high state and the other is at the low state (the comparison result CR is generated), the comparison determining circuit 120 sets the stage indication signal TIS at the comparison stage finished state.

The time accumulating circuit 130 begins accumulating an accumulated time AT when the enabling signal EN is at the enabling state, and stop accumulating the accumulated time AT when the stage indication signal TIS is at the comparison stage finished state to generate a comparison time.

Figure 2:
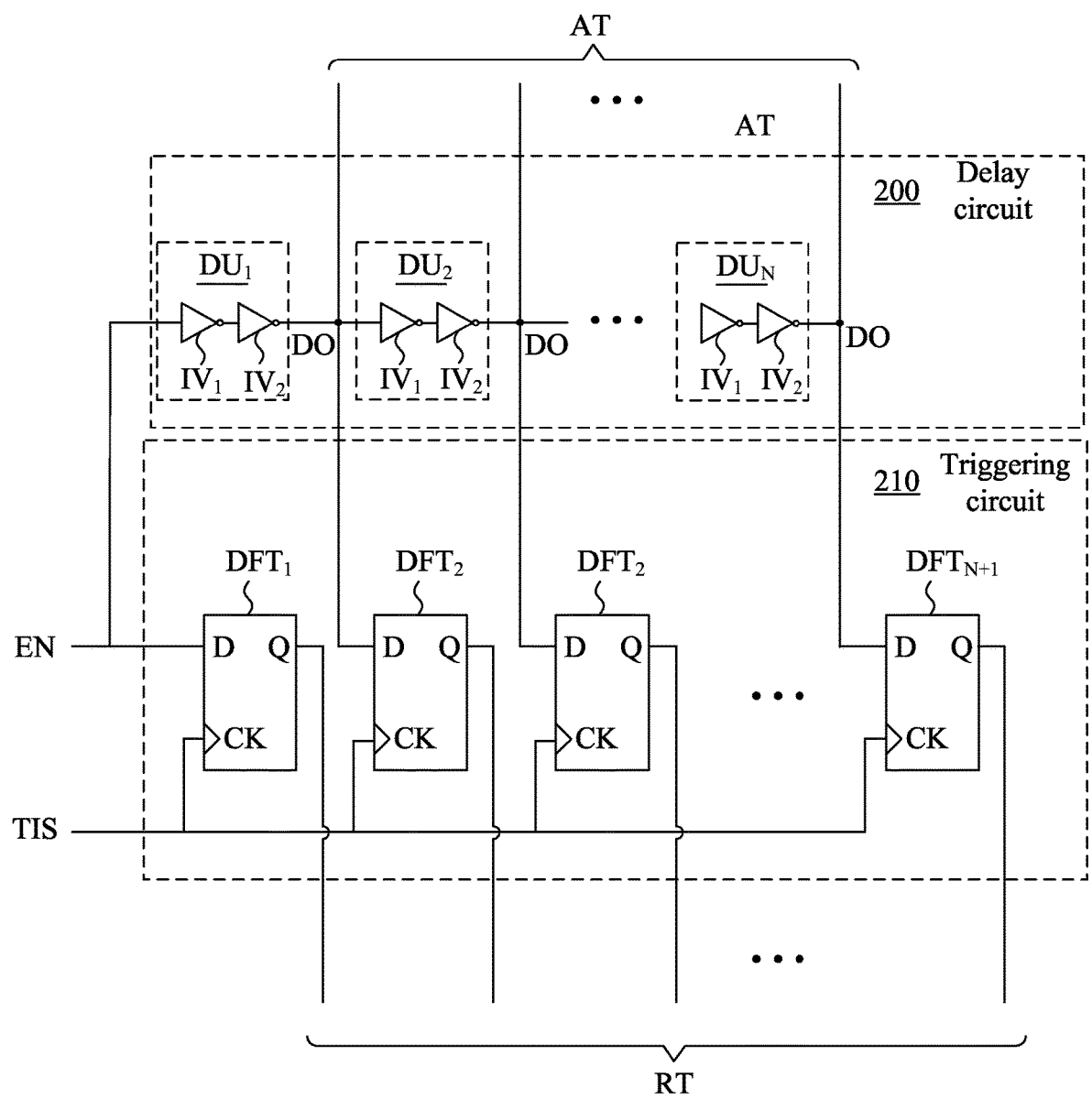
FIG. 2 illustrates a circuit diagram of the time accumulating circuit according to an embodiment of the present invention.

Reference is now made to FIG. 2. FIG. 2 illustrates a circuit diagram of the time accumulating circuit 130 according to an embodiment of the present invention. The time accumulating circuit 130 includes a delay circuit 200 and a triggering circuit 210.

The delay circuit 200 includes a plurality of delay units $DU_1$-$DU_N$ coupled in series and configured to transmit the enabling signal EN. In an embodiment, each of the delay units $DU_1$-$DU_N$ includes an even number of inverters coupled in series, such that the enabling signal EN outputted by each of the delay units $DU_1$-$DU_N$ has the same state. In the present embodiment, two inverters $IV_1$ and $IV_2$ coupled in series are illustrated as an example. However, the present invention is not limited thereto.

The triggering circuit 210 includes a plurality of triggering D flip-flops $DFT_1$-$DFT_{N+1}$ coupled in series. Each of the triggering D flip-flops $DFT_1$-$DFT_{N+1}$ includes an input terminal D, an output terminal Q and a clock input terminal CK.

The input terminal D of the first triggering D flip-flop $DFT_1$ is configured to directly receive the enabling signal EN. The input terminal D of each of the other triggering D flip-flops $DFT_2$-$DFT_N$ is electrically coupled to one of the delay units $DU_1$-$DU_N$ to receive the enabling signal EN transmitted by one of the delay units $DU_1$-$DU_N$. In the present embodiment, the number of the triggering D flip-flops $DFT_2$-$DFT_{N+1}$ is more than the number of the delay units $DU_1$-$DU_N$ by 1. The clock input terminal CLK receives the stage indication signal TIS.

In an embodiment, the output terminal of each of the delay units $DU_1$-$DU_N$ is reset to the low state in the beginning of a comparison performed by the comparator 110. The output terminal DO of each of the delay units $DU_1$-$DU_N$ is reset according to such as, but not limited to an impulse signal (not illustrated in the figure) generated according to the enabling signal EN. The output terminal DO of each of the delay units $DU_1$-$DU_N$ in turns transmits the enabling signal EN at the enabling state during the process of comparison. The accumulated time AT is determined by the number of the delay units that finish transmitting the enabling signal EN at the enabling state.

The output terminal Q of each of the triggering D flip-flops $DFT_1$-$DFT_N$ outputs the signal at the input terminal D when the stage indication signal TIS is at the comparison stage finished state.

As a result, the comparison time RT is determined by the number of the triggering D flip-flops that output the enabling signal EN at the enabling state. Such a number is related to the total delay time length of the delay units that finish transmitting the enabling signal EN at the enabling state.

For example, when the number of the triggering D flip-flops that output the enabling signal EN at the enabling state at the output terminal Q is 5, the delay units that transmit the enabling signal EN at the enabling state is known as 4. The total delay time length of these delay units can be obtained by multiplying a unit delay time that a single delay unit required to transmit the signal by the number of the delay units, such that the total delay time length serves as the comparison time RT. In a numerical example, the unit delay time of a single delay unit is 0.1-0.2 nanoseconds. Take the unit delay time of 0.1 nanosecond as an example, the total delay time length of four delay units is 0.4 nanoseconds.

The determining circuit 140 is electrically coupled to the delay output terminal DO of each of the delay units $DU_1$-$DU_N$ and obtains the accumulated time AT according to the number of the delay units that output the enabling signal EN at the enabling state from the delay output terminal DO. Further, the determining circuit 140 is electrically coupled to the output terminal Q of each of the triggering D flip-flops $DFT_1$-$DFT_N$ to obtain the comparison time RT according to the number of the triggering D flip-flops that output the enabling signal EN at the enabling state from the output terminal Q.

The determining circuit 140, in each of the comparison stages, performs statistics on the comparison time RT to generate a predetermined threshold time TT. More specifically, in a multiple rounds of analog-to-digital conversion, the determining circuit 140 records the comparison time RT of each of the comparison stages to perform statistics by such as, but not limited to averaging the recorded values. The determining circuit 140 thus obtains the comparison time RT, which is the average time of the generation of the comparison result CR in each of the comparison states, and sets the predetermined threshold time TT accordingly.

In different embodiments, the determining circuit 140 may directly set the averaged comparison time RT as the predetermined threshold time TT, or set the value that adds a predetermined value to the averaged comparison time RT as the predetermined threshold time TT. Further, the determining circuit 140 may store the predetermined threshold time TT in a storage circuit (not illustrated in the figure) either disposed in the determining circuit 140 or outside of the determining circuit 140.

The determining circuit 140, in each of the comparison stages, further sets a predetermined comparison result DR as the comparison result CR under the condition that the comparison result CR is not generated and the accumulated time AT exceeds the predetermined threshold time TT.

More specifically, when the comparison result CR is generated by the comparator 110 before the accumulated time AT exceeds the predetermined threshold time TT, the control circuit 170 switches the configuration of the digital-to-analog conversion circuit 160 by using the digital codes DC according to the comparison result CR. When the comparison result CR is not generated by the comparator 110 and the accumulated time AT exceeds the predetermined threshold time TT, the determining circuit 140 directly set the predetermined comparison result DR as the comparison result CR. The control circuit 170 switches the configuration of the digital-to-analog conversion circuit 160 by using the digital codes DC according to the predetermined comparison result DR.

In an embodiment, the control circuit 170 determines that one of the first voltage Va and the second voltage Vb is larger than the other according to the predetermined comparison result DR. More specifically, the determining circuit 140 may also generate the predetermined comparison result DR that includes two predetermined output results, in which one of the two predetermined output results is the high state and the other is the low state.

By using the mechanism described above, the analog-to-digital conversion circuit 150 can avoid the condition that the comparison result CR is not generated in a comparison time that is overly long.

In an embodiment, for each of a plurality of different environment conditions, the determining circuit 140 generates the predetermined threshold time TT corresponding thereto. The determining circuit 140 performs determination according to the predetermined threshold time TT corresponding to one of the environment conditions being detected. Each of the environment conditions may correspond to a process corner.

For example, the environment conditions including operation voltages, environment temperatures and manufacturing process deviation result in the operation speed variation of the P-type components and N-type components. When the environment condition corresponds to the "Fast-Fast (FF)" process corner, the P-type components and N-type components have faster operation speed. Under such a condition, the predetermined threshold time TT generated by the determining circuit 140 according to the statistics of comparison time RT in the same comparison stage is smaller. When the environment condition corresponds to the "Slow-Slow (SS)" process corner, the P-type components and N-type components have slower operation speed. Under such a condition, the predetermined threshold time TT generated by the determining circuit 140 according to the statistics of comparison time RT in the same comparison stage is larger.

It is appreciated that the environment conditions described above is merely an example. In other embodiments, other environment parameters can be used to set the environment conditions.

As a result, the determining circuit 140 can detect the voltage, temperature or other environment conditions that the comparison circuit 100 corresponds according to such as, but not limited to an environment parameter detection circuit (not illustrated in the figure). The determining circuit 140 further determines that whether the accumulated time AT that the comparator 110 performs comparison is overly long according to the predetermined threshold time TT corresponding to the detected environment condition. When the accumulated time AT exceeds the predetermined threshold time TT, the determining circuit 140 sets the predetermined comparison result DR as the comparison result CR.

As a result, the comparison circuit having adaptive comparison mechanism of the present invention performs statistics on a comparison time of a comparator and sets a predetermined threshold time, such that when a comparison result is generated under the condition that an accumulated time of the operation of the comparator exceeds the predetermined threshold time, a predetermined comparison result is directly set to be the comparison result. The condition that the comparison result is not generated in a comparison time that is too long can be avoided.

It is appreciated that the circuit configuration and the number of circuit components included in each of the circuits are merely an example. In different embodiments, the circuit configuration and the number of the components included in the circuits can be modified depending on practical requirements without affecting the function of the system. Further, the logic circuit and the states of high and low related thereto described above are merely an example. In different embodiments, the other logic circuits can be used or can be operated according to the states that are the inverse of the states described above depending on practical requirements without affecting the function of the system. The present invention is not limited thereto.

Figure 3:
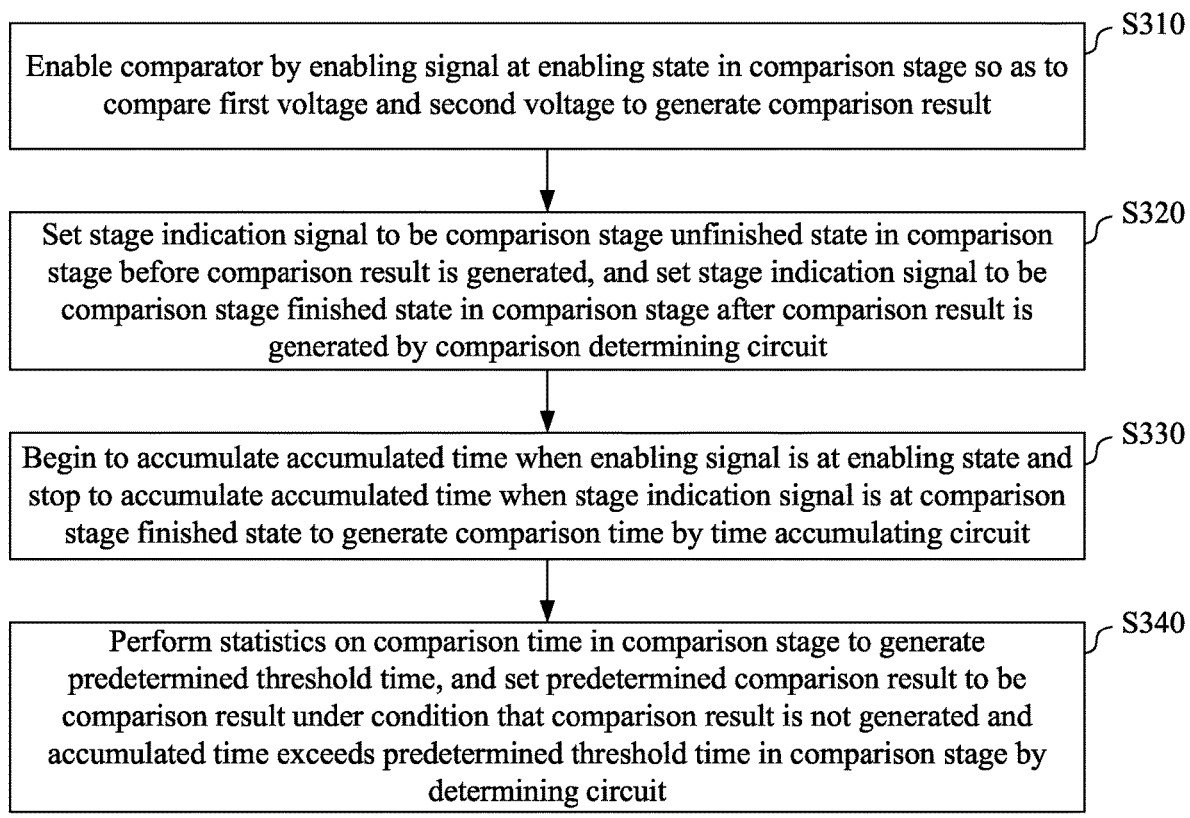
FIG. 3 illustrates a flow chart of a comparison circuit operation method having adaptive comparison mechanism according to an embodiment of the present invention.

Reference is now made to FIG. 3. FIG. 3 illustrates a flow chart of a comparison circuit operation method 300 having adaptive comparison mechanism according to an embodiment of the present invention.

In addition to the apparatus described above, the present disclosure further provides the comparison circuit operation method 300 having adaptive comparison mechanism that can be used in such as, but not limited to, the comparison circuit 100 in FIG. 1. As illustrated in FIG. 3, an embodiment of the comparison circuit operation method 300 includes the following steps.

In step S310, the comparator 110 is enabled by the enabling signal EN at the enabling state in the comparison stage so as to compare the first voltage Va and the second voltage Vb to generate the comparison result CR.

In step S320, the stage indication signal TIS is set to be the comparison stage unfinished state in the comparison stage before the comparison result CR is generated, and the stage indication signal TIS is set to be the comparison stage finished state in the comparison stage after the comparison result CR is generated by the comparison determining circuit 120.

In step S330, the accumulated time AT is began to be accumulated when the enabling signal EN is at the enabling state and the accumulated time AT is stopped to be accumulated when the stage indication signal TIS is at the comparison stage finished state to generate the comparison time RT by the time accumulating circuit 130.

In step S340, statistics is performed on the comparison time RT in the comparison stage to generate the predetermined threshold time, and the predetermined comparison result DR is further set to be the comparison result CR under the condition that the comparison result CR is not generated and the accumulated time exceeds the predetermined threshold time in the comparison stage by the determining circuit 140.

Figure 4:
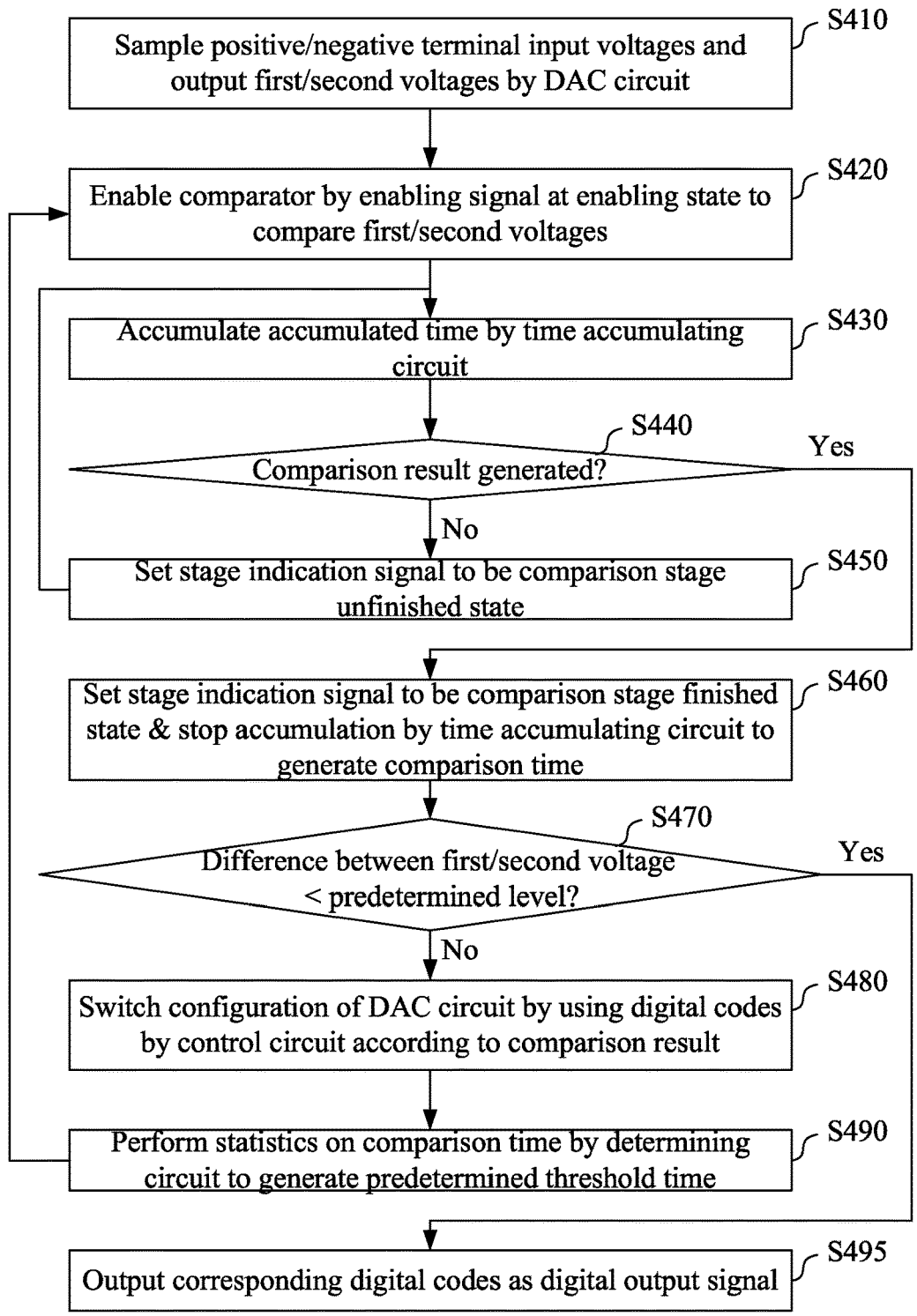
FIG. 4 illustrates a flow chart of a comparison circuit operation method when the comparison circuit is used in the analog-to-digital conversion circuit according to an embodiment of the present invention.

Reference is now made to FIG. 4. FIG. 4 illustrates a flow chart of a comparison circuit operation method 400 when the comparison circuit 100 is used in the analog-to-digital conversion circuit 150 according to an embodiment of the present invention. The comparison circuit operation method 400 includes steps outlined below.

In step S410, the positive terminal input voltage Vip and negative terminal input voltage Vin are sampled and the first voltage Va and the second voltage Vb are outputted by the digital-to-analog conversion circuit 160.

In step S420, the comparator 110 is enabled by the enabling signal EN at the enabling state in each of the comparison stages so as to compare the first voltage Va and the second voltage Vb.

In step S430, the accumulated time AT is began to be accumulated by the time accumulating circuit 130 when the enabling signal EN is at the enabling state.

In step S440, whether the comparison result CR is generated is determined.

In step S450, the stage indication signal TIS is set to be the comparison stage unfinished state by the comparison determining circuit 120 before the comparison result CR is generated. The flow goes back to step S330 such that the time accumulating circuit 130 accumulates the accumulated time AT.

In step S460, the stage indication signal TIS is set to be the comparison stage finished state by the comparison determining circuit 120 after the comparison result CR comparison result CR is generated. The accumulation is stopped by the time accumulating circuit 130 to generate the comparison time RT when the stage indication signal TIS is at the comparison stage finished state.

In step S470, whether the difference between the first voltage Va and the second voltage Vb is smaller than the predetermined level is determined.

In step S480, the difference between the first voltage Va and the second voltage Vb is not smaller than the predetermined level, the configuration of the digital-to-analog conversion circuit 160 is switched by using the digital codes DC by the control circuit 170 according to the comparison result CR.

In step S490, statistics is performed on the comparison time RT by the determining circuit 140 to generate the predetermined threshold time. The flow goes back to step S320 to perform the comparison of the next comparison stage. It is appreciated that in an embodiment, the determining circuit 140 can perform statistics with the previous comparison times every time a new comparison time RT is obtained. In other embodiments, the determining circuit 140 performs statistics after a certain times of new comparison times are obtained.

In step S495, when the difference between the first voltage Va and the second voltage Vb is smaller than the predetermined level, the control circuit 170 outputs the corresponding digital codes DC as the digital output signal DOUT.

Figure 5:
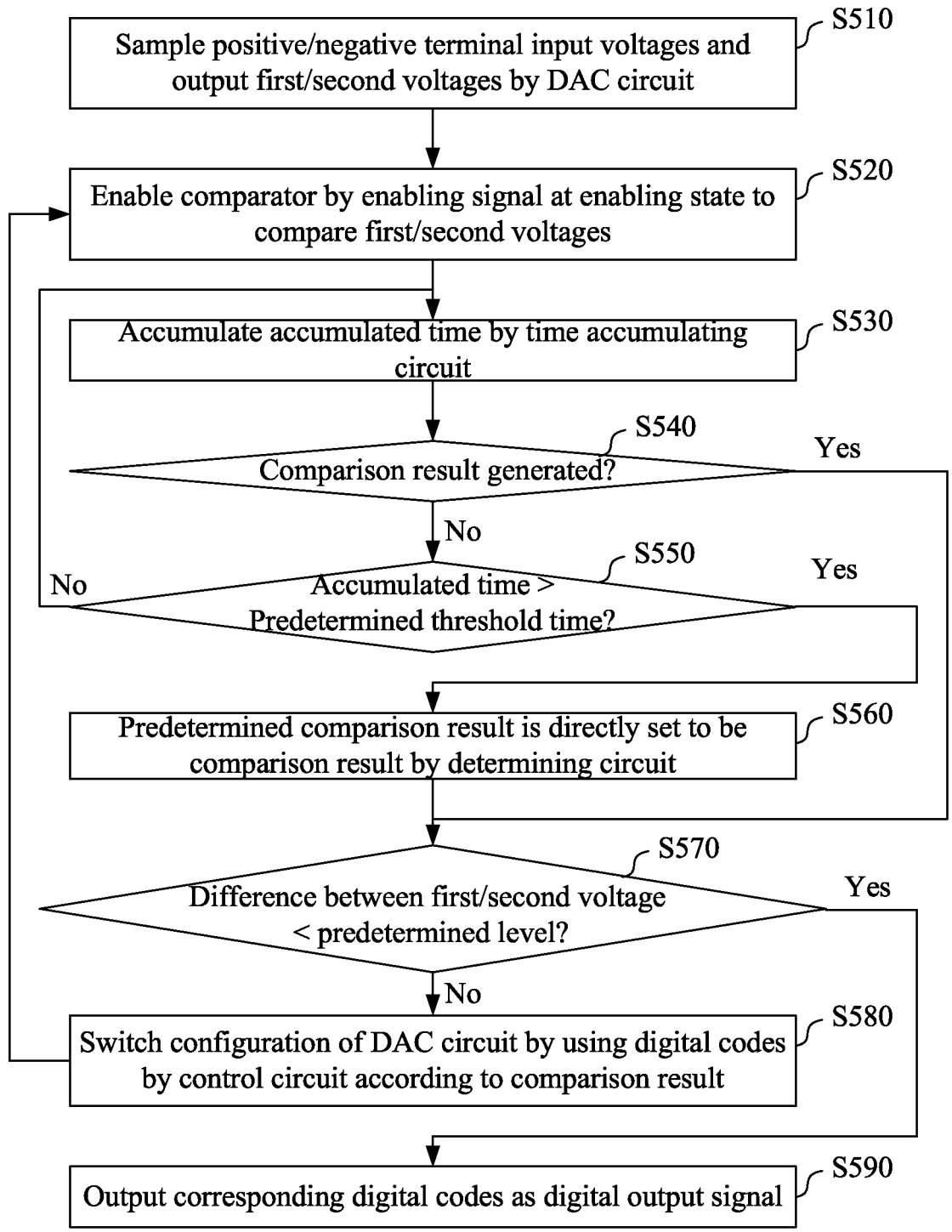
FIG. 5 illustrates a flow chart of a comparison circuit operation method when the comparison circuit is used in the analog-to-digital conversion circuit according to another embodiment of the present invention.

Reference is now made to FIG. 5. FIG. 5 illustrates a flow chart of a comparison circuit operation method 500 when the comparison circuit 100 is used in the analog-to-digital conversion circuit 150 according to another embodiment of the present invention. The comparison circuit operation method 500 includes steps outlined below.

In step S510, the positive terminal input voltage Vip and negative terminal input voltage Vin are sampled and the first voltage Va and the second voltage Vb are outputted by the digital-to-analog conversion circuit 160.

In step S520, the comparator 110 is enabled by the enabling signal EN at the enabling state in each of the comparison stages so as to compare the first voltage Va and the second voltage Vb.

In step S530, the accumulated time AT is began to be accumulated by the time accumulating circuit 130 when the enabling signal EN is at the enabling state.

In step S540, whether the comparison result CR is generated is determined.

In step S550, whether the accumulated time AT exceeds the predetermined threshold time is determined before the comparison result CR is generated. When the accumulated time AT does not exceed the predetermined threshold time, the flow goes back to step S430 such that the time accumulating circuit 130 accumulates the accumulated time AT.

In step S560, when the accumulated time AT exceeds the predetermined threshold time, the predetermined comparison result DR is directly set to be the comparison result CR by the determining circuit 140.

In step S570, when the comparison result CR is determined to be generated in step S540, or when the predetermined comparison result DR is directly set to be the comparison result CR by the determining circuit 140 in step S560, whether the difference between the first voltage Va and the second voltage Vb is smaller than the predetermined level is determined.

In step S580, when the difference between the first voltage Va and the second voltage Vb is not smaller than the predetermined level, the configuration of the digital-to-analog conversion circuit 160 is switched by using the digital codes DC by the control circuit 170 according to the comparison result CR. The flow goes back to step S520 to perform the comparison of the next comparison stage.

In step S590, when the difference between the first voltage Va and the second voltage Vb is smaller than the predetermined level, the control circuit 170 outputs the corresponding digital codes DC as the digital output signal DOUT.

In an embodiment, the analog-to-digital conversion method 300 in FIG. 3 and the analog-to-digital conversion method 400 in FIG. 4 can be selectively performed in different stages or performed simultaneously.

It is appreciated that the embodiments described above are merely an example. In other embodiments, it should be appreciated that many modifications and changes may be made by those of ordinary skill in the art without departing, from the spirit of the disclosure.

In summary, the present invention discloses the comparison circuit and the comparison circuit operation method thereof having adaptive comparison mechanism to perform statistics on a comparison time of a comparator and set a predetermined threshold time, such that when a comparison result is generated under the condition that an accumulated time of the operation of the comparator exceeds the predetermined threshold time, a predetermined comparison result is directly set to be the comparison result. The condition that the comparison result is not generated in a comparison time that is overly long can be avoided.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A comparison circuit having adaptive comparison mechanism, comprising:
   a comparator configured to be enabled by an enabling signal at an enabling state in a comparison stage so as to compare a first voltage and a second voltage to generate a comparison result;
   a comparison determining circuit configured to set a stage indication signal to be a comparison stage unfinished state in the comparison stage before the comparison result is generated, and set the stage indication signal to be a comparison stage finished state in the comparison stage after the comparison result is generated;

a time accumulating circuit configured to begin accumulating an accumulated time when the enabling signal is at the enabling state and stop accumulating the accumulated time when the stage indication signal is at the comparison stage finished state to generate a comparison time; and a determining circuit configured to perform statistics on the comparison time in the comparison stage to generate a predetermined threshold time, and further set a predetermined comparison result to be the comparison result under the condition that the comparison result is not generated and the accumulated time exceeds the predetermined threshold time in the comparison stage.

2. The comparison circuit of claim 1, wherein for each of a plurality of different environment conditions, the determining circuit generates the predetermined threshold time corresponding thereto and performs determination according to the predetermined threshold time corresponding to one of the environment conditions being detected.

3. The comparison circuit of claim 2, wherein each of the environment conditions corresponds to a process corner.

4. The comparison circuit of claim 1, wherein the time accumulating circuit comprises:

a delay circuit comprising a plurality of delay units coupled in series configured to transmit the enabling signal; and a triggering circuit comprising a plurality of triggering D flip-flops coupled in series each comprising:

an input terminal, wherein the input terminal of a first one of the triggering D flip-flops is configured to receive the enabling signal directly and each of the other triggering D flip-flops is electrically coupled to one of the delay units to receive the enabling signal that the one of the delay units transmit;

an output terminal; and a clock input terminal configured to receive the stage indication signal;

wherein the output terminal of each of the triggering D flip-flops outputs a signal at the input terminal when the stage indication signal is at the comparison stage finished state, in which the comparison time is determined by a number of the triggering D flip-flops that output the enabling signal at the enabling state, and the number is related to a total delay time length of the delay units transmitting the enabling signal at the enabling state.

5. The comparison circuit of claim 4, wherein the determining circuit is electrically coupled to a delay output terminal of each of the delay units and obtains the accumulated time accordingly, and the determining circuit is electrically coupled to an output terminal of each of the triggering D flip-flops to obtain the comparison time accordingly.

6. The comparison circuit of claim 1, wherein the comparison circuit is disposed in an analog-to-digital conversion (ADC) circuit and the comparator is configured to be enabled by the enabling signal at the enabling state in each of a plurality of comparison stages so as to compare the first voltage and the second voltage respectively to generate the comparison result, the comparison circuit further comprises:

a digital-to-analog conversion (DAC) circuit configured to sample a positive terminal input voltage and a negative terminal input voltage to output the first voltage and the second voltage; and a control circuit configured to, in each of the comparison stages, switch a configuration of the digital-to-analog conversion circuit by using a set of digital codes according to the comparison result, and configured to output the corresponding set of digital codes as a digital output signal when a difference between the first voltage and the second voltage is smaller than a predetermined level.

7. A comparison circuit operation method having adaptive comparison mechanism, comprising:

enabling a comparator by an enabling signal at an enabling state in a comparison stage so as to compare a first voltage and a second voltage to generate a comparison result;

setting a stage indication signal to be a comparison stage unfinished state in the comparison stage before the comparison result is generated, and setting the stage indication signal to be a comparison stage finished state in the comparison stage after the comparison result is generated by a comparison determining circuit;

beginning accumulating an accumulated time when the enabling signal is at the enabling state and stopping accumulating the accumulated time when the stage indication signal is at the comparison stage finished state to generate a comparison time by a time accumulating circuit; and performing statistics on the comparison time in the comparison stage to generate a predetermined threshold time, and further setting a predetermined comparison result as the comparison result under the condition that the comparison result is not generated and the accumulated time exceeds the predetermined threshold time in the comparison stage by a determining circuit.

8. The comparison circuit operation method of claim 7, further comprising:

for each of a plurality of different environment conditions, generating the predetermined threshold time corresponding thereto and performing determination according to the predetermined threshold time corresponding to one of the environment conditions being detected by the determining circuit.

9. The comparison circuit operation method of claim 8, wherein each of the environment conditions corresponds to a process corner.

10. The comparison circuit operation method of claim 7, wherein the time accumulating circuit comprises a delay circuit and a triggering circuit, and the triggering circuit comprises a plurality of triggering D flip-flops coupled in series each comprising an input terminal, an output terminal and a clock input terminal configured to receive the stage indication signal, the comparison circuit operation method further comprising:

transmitting the enabling signal by a plurality of delay units coupled in series comprised by the delay circuit;

receiving the enabling signal directly by the input terminal of a first one of the triggering D flip-flops and receiving the enabling signal that the one of the delay units transmit by each of the other triggering D flip-flops electrically coupled to one of the delay units; and outputting a signal at the input terminal to the output terminal of each of the triggering D flip-flops when the stage indication signal is at the comparison stage finished state;

wherein the comparison time is determined by a number of the triggering D flip-flops that output the enabling signal at the enabling state, and the number is related to a total delay time length of the delay units transmitting the enabling signal at the enabling state.

11. The comparison circuit operation method of claim 10, further comprising:
obtaining the accumulated time according to the delay output terminal of each of the delay units that the determining circuit is electrically coupled to; and
obtaining the comparison time according to an output terminal of each of the triggering D flip-flops that the determining circuit is electrically coupled.

12. The comparison circuit operation method of claim 7, wherein the comparison circuit is disposed in an analog-to-digital conversion circuit, the comparison circuit operation method further comprises:
enabling the comparator enabled by the enabling signal at the enabling state in each of a plurality of comparison stages so as to compare the first voltage and the second voltage respectively to generate the comparison result;
sampling a positive terminal input voltage and a negative terminal input voltage to output the first voltage and the second voltage by a digital-to-analog conversion (DAC) circuit of the comparison circuit; and
in each of the comparison stages, switching a configuration of the digital-to-analog conversion circuit by using a set of digital codes according to the comparison result, and outputting the corresponding set of digital codes as a digital output signal when a difference between the first voltage and the second voltage is smaller than a predetermined level by a control circuit of the comparison circuit.

* * * * *